United States Patent
Cheng

(10) Patent No.: US 10,643,822 B2
(45) Date of Patent: May 5, 2020

(54) IMPEDANCE MATCHING METHOD AND DEVICE FOR PULSED RADIO FREQUENCY POWER SUPPLY

(71) Applicant: BEIJING NAURA MICROELECTRONICS EQUIPMENT CO., LTD, Beijing (CN)

(72) Inventor: Xiaoyang Cheng, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 553 days.

(21) Appl. No.: 15/538,903

(22) PCT Filed: Apr. 29, 2015

(86) PCT No.: PCT/CN2015/077779
§ 371 (c)(1),
(2) Date: Jun. 22, 2017

(87) PCT Pub. No.: WO2016/110027
PCT Pub. Date: Jul. 14, 2016

(65) Prior Publication Data
US 2017/0345621 A1   Nov. 30, 2017

(30) Foreign Application Priority Data
Jan. 6, 2015   (CN) .......................... 2015 1 0004040

(51) Int. Cl.
*H01J 37/32* (2006.01)
*H01L 21/02* (2006.01)
(Continued)

(52) U.S. Cl.
CPC ........ *H01J 37/32183* (2013.01); *H01J 37/32* (2013.01); *H01J 37/32146* (2013.01);
(Continued)

(58) Field of Classification Search
CPC ................. H01J 37/32; H01J 37/32146; H01J 37/32183; H01L 21/02; H03H 7/40; H05H 1/46; H05H 2001/4682
See application file for complete search history.

(56) References Cited

U.S. PATENT DOCUMENTS

| 5,815,047 A | 9/1998 | Sorensen et al. |
| 2008/0044321 A1 | 2/2008 | Lee |
| 2008/0284537 A1* | 11/2008 | Ikenouchi ................ H03H 7/40 333/17.3 |

FOREIGN PATENT DOCUMENTS

| CN | 1270711 A | 10/2000 |
| CN | 1852628 A | 10/2006 |

(Continued)

OTHER PUBLICATIONS

The World Intellectual Property Organization (WIPO) International Search Report for PCT/CN2015/077779 dated Oct. 12, 2015 6 Pages.

*Primary Examiner* — Dedei K Hammond
(74) *Attorney, Agent, or Firm* — Anova Law Group, PLLC

(57) ABSTRACT

An impedance matching method and device for a pulsed RF power supply are provided. The impedance matching method includes: a coarse adjustment step: performing adjustment based on a current load impedance to make a current reflection coefficient |Γ| no greater than an ignition reflection coefficient |Γt|, and setting a current position as an ignition position; a fine adjusting step: keeping the ignition position unchanged, performing real-time adjustment based on the current load impedance to realize impedance match- (Continued)

ing, and setting a current position as a matching position; and a switching step: after impedance matching is realized for the first time, switching between the ignition position and the matching position in different pulse time durations of each subsequent pulse period to realize impedance matching in different pulse periods. The impedance matching method and device may improve matching efficiency, process stability and utilization of the pulsed RF power supply.

13 Claims, 8 Drawing Sheets

(51) Int. Cl.
 *H03H 7/40* (2006.01)
 *H05H 1/46* (2006.01)
(52) U.S. Cl.
 CPC ............... *H01L 21/02* (2013.01); *H03H 7/40* (2013.01); *H05H 1/46* (2013.01); *H05H 2001/4682* (2013.01)

(56) References Cited

FOREIGN PATENT DOCUMENTS

| | | |
|---|---|---|
| CN | 101783281 A | 7/2010 |
| CN | 101964295 A | 2/2011 |
| CN | 101783281 B | 1/2012 |
| CN | 101964295 B | 4/2013 |
| JP | H09260096 A | 10/1997 |
| JP | 2006139949 A | 6/2006 |
| JP | 2008202990 A | 9/2008 |
| JP | 2013196822 A | 9/2013 |
| JP | 2015062468 A | 4/2015 |
| WO | 2005116293 A1 | 12/2005 |
| WO | 2013132591 A1 | 9/2013 |

* cited by examiner

IMPEDANCE MATCHING METHOD AND DEVICE FOR PULSED RADIO FREQUENCY POWER SUPPLY

FIELD OF THE DISCLOSURE

The present disclosure relates to the technical field of semiconductor device manufacturing and, more particularly, relates to an impedance matching method and device for a pulsed radio frequency (RF) power supply.

BACKGROUND

A semiconductor processing apparatus often excites a process gas in a reaction chamber to form plasma by applying the RF energy provided by the RF power supply into the reaction chamber with a high vacuum environment. The plasma includes a large amount of active particles, such as electrons, ions, excited atoms, molecules, and free radicals. The active particles react physically and/or chemically with a surface of a wafer exposed to the plasma environment, thereby fulfilling etching, deposition, or other processes of the wafer. As the integrated circuit further develops, the existing technology cannot meet requirements for an etching process with a dimension of 22 nm or less. As such, a pulsed RF power supply is used as a plasma excitation source to reduce the plasma induced damage caused by continuous-wave RF energy and enlarge the process adjustment method and the process window. Currently, a key factor that restricts the development of the pulsed RF power supply as the plasma excitation source is the impedance matching technique for the pulsed RF power supply. Impedance matching refers to matching the load impedance of the pulsed RF power supply with the characteristic impedance (generally, 50 ohms) of the pulsed RF power supply. The common pulsed frequency range of the pulsed RF power supply is 100~100 kHz, and the range of the duty cycle is 10%~90%. Accordingly, each pulse width is only a few milliseconds. However, by using the existing impedance matching device that relies on the method of mechanical adjustment, impedance matching can hardly be fulfilled within such a few milliseconds, resulting in a low matching accuracy and a high reflection power (generally, 20%) of the pulsed RF power supply. Thus, the utilization of the pulsed RF power supply is poor.

Accordingly, an impedance matching device shown in FIG. 1 is used in existing technologies. The impedance matching device primarily uses the method of electronic adjustment, and occasionally uses the method of mechanical adjustment. Referring to FIG. 1, the impedance matching device 10 includes a control unit 11, an execution unit 12, and a matching network 13. The pulsed RF power supply 14 has a frequency-sweep function and sends a pulse synchronous signal to the control unit 11, and the pulse synchronous signal is shown in FIG. 2. During a high voltage level period, the pulsed RF power supply 14 is modulated with a RF power signal, and during a low voltage level period, the pulsed RF power supply 14 is not modulated with a RF power signal. An impedance adjustable element is disposed in the matching network 13; the pulsed RF power supply 14 automatically performs frequency-sweep matching in a high voltage level period (i.e., the pulse frequency with the maximum output power is obtained by automatic adjustment based on the load impedance of the pulsed RF power supply 14); the control unit 11 acquires a current pulse frequency of the pulsed RF power supply 14 in the high voltage level period of each pulse period in real-time based on the pulse synchronous signal, calculates a current load impedance of the pulsed RF power supply 14 according to the current pulse frequency, a circuit structure of the matching network 13 and a current position of the impedance adjustable element of the matching network 13, and determines whether the current load impedance matches the characteristic impedance of the pulsed RF power supply 14. If the current load impedance matches the characteristic impedance of the pulsed RF power supply 14, the current position of the impedance adjustable element is maintained at the low voltage level of the current pulse period. That is, the matching position is maintained. If the current load impedance does not match the characteristic impedance of the pulsed RF power supply 14, the execution unit 12 is controlled to adjust the position of the impedance adjustable element when the current pulse period is at low voltage levels, thereby performing impedance matching by adjusting the load impedance of the pulsed RF power supply 14.

FIG. 3 is a structural schematic diagram of a reaction chamber using an existing impedance matching device. Referring to FIG. 3, an induction coil 21 is disposed above the top of the reaction chamber 20, and the induction coil 21 is electrically connected to a first RF power supply 23 via a first impedance matching device 22. An electrostatic chuck 24 for bearing a wafer S is disposed in a bottom region inside the reaction chamber 20, and the electrostatic chuck 24 is electrically connected to a second RF power supply 26 via a second impedance matching device 25. The first RF power supply 23 adopts a continuous-wave signal output mode, namely, the first RF power supply 23 continuously outputs a RF power signal. The second RF power supply 26 is a pulsed RF power supply, the frequency of the RF power signal generated by the second RF power supply is 13.56 MHz, the frequency of the pulse synchronous signal is 100 Hz, and the duty cycle is 90%. The second impedance matching device 25 uses the impedance matching device illustrated in FIG. 1.

Under the aforementioned conditions, FIG. 4 is a schematic diagram of the matching status of the second impedance matching device 25 at different time points in an impedance matching process. Referring to FIG. 4, specifically, during a first pulse period: in the high voltage level period, the RF power supply 26 starts automatic frequency-sweep matching and remains in a status of "under matching", that is, the impedance matching is not realized; in the low voltage level period, the control unit 11 performs impedance matching by controlling the execution unit 12 to adjust the position of the impedance adjustable element. During a second pulse period: in the high voltage level period, the RF power supply 26 starts the automatic frequency-sweep matching, and after a period of T, the status of "under matching" is changed to a status of "matched", namely, the impedance matching not being realized is changed into the impedance matching is realized; in the low voltage level period, the matching position remains unchanged. The matching processes of a third pulse period and a subsequent pulse period are similar to the matching process of the second pulse period, and are not repeated herein.

Correspondingly, FIG. 5 is an impedance changing trajectory of the load impedance of the second RF power supply in the impedance matching process represented by the Smith chart. Referring to FIG. 5, the most central point of the Smith chart represents one matched resistance value (50 ohms), and the position where the most central point is located is called an impedance matching point. In such Smith chart, the impedance matching process is actually a moving process of the load impedance from an edge position of the chart towards the most central position of the chart, and the moving process specifically includes traversing the impedance zone 1, the impedance zone 2, the impedance zone 3, and the impedance zone 4 sequentially.

When the pulsed RF power supply 26 is not turned on, the load impedance is the impedance induced by an interference signal and is shown as the impedance zone 1 outside of the circle in the Smith chart. After the pulsed RF power supply 26 is turned on, in the high voltage level period of the first pulse period of the impedance matching process, the current load impedance is initially located in the impedance zone 2, the impedance value is approximately $6\angle -86°$, and at this moment, the pulsed RF power supply 26 has not realized ignition in the reaction chamber. As the pulsed RF power supply 26 performs automatic frequency-sweep matching, the current load impedance moves gradually from the impedance zone 2 towards the impedance matching position but has not reached the impedance matching point. In the low voltage level period of the first pulse period, no impedance matching is performed, and at this moment, the load impedance is located in the impedance zone 4 outside of the Smith circle and is the coupled signal impedance of the induction coil 21. During the second pulse period of the impedance matching process, in the high voltage level period, because the impedance adjustable element is adjusted in the low voltage level period of the first pulse period, the load impedance is, at the very beginning, located in a non-ignition impedance zone of the impedance zone 2 that moves a certain distance towards the impedance matching point. Accordingly, the pulsed RF power supply 26 does not realize ignition at first. As the pulsed RF power supply 26 performs automatic frequency-sweep matching, the current load impedance moves to the impedance zone 3, the impedance value is approximately $40\angle 25°$, and by then, impedance matching is basically realized. In the low voltage level period of the second pulse period, the load impedance is the same located in the impedance zone 4. The movement processes of the load impedance corresponding to the third pulse period and the subsequent pulse period are similar to the movement process of the load impedance corresponding to the second pulse period, and are not repeated herein.

In practical applications, the following technical issues often exist when the aforementioned existing impedance matching device is used to perform impedance matching on the pulsed RF power supply. Because the function of the pulsed RF power supply in a processing process is to excite the process gas in the reaction chamber to form plasma, and the load impedance of the pulsed RF power supply when the reaction chamber is ignited is different from the load impedance of the pulsed RF power supply when the impedance matching is realized. Thus, after the impedance matching is realized for the first time, in the high voltage level period of each subsequent pulse period, the pulsed RF power supply needs to first realize the ignition of the reaction chamber and then realize the impedance matching. That is, in the high voltage level period of each subsequent pulse period, to realize the ignition of the process gas, the load impedance needs to be adjusted from the matched load impedance value obtained in the previous pulse period to ignition load impedance value. After ignition, the automatic frequency-sweep matching process shown in FIG. 4 and FIG. 5 may be used to match the load impedance until the load impedance value that realizes matching is achieved. In other words, when using the existing impedance matching device to realize impedance matching, the high voltage level period of each subsequent pulse period needs to undergo a relatively long automatic frequency-sweep matching period T. Thus, the matching efficiency is low, resulting in poor processing stability and low utilization of the pulsed RF power supply.

Therefore, an impedance matching method and device thereof that can implement rapid impedance matching for a pulsed RF power supply are urgently needed.

SUMMARY OF THE DISCLOSURE

Directed to solving the technical issues existing in the prior art, the present disclosure provides an impedance matching device and a semiconductor processing apparatus that may rapidly realize the impedance matching for the pulsed RF power supply. Accordingly, the processing stability may be enhanced, and the utilization of the RF energy of the pulsed RF power supply may be improved.

To solve the technical issues existing in the prior art, the present disclosure provides an impedance matching method for a pulsed RF power supply, and the impedance matching method includes the following steps: a coarse adjustment step, where adjustment is performed based on the current load impedance, such that the current reflection coefficient $|\Gamma|$ is no greater than an ignition reflection coefficient $|\Gamma t|$, and a current position is set as an ignition position; a fine adjustment step, where the ignition position remains unchanged, real-time adjustment is performed to realize impedance matching based on the current load impedance, and a current position is set as a matching position; and a switching step, where after the impedance matching is realized for the first time, in different pulse time durations of each subsequent pulse period, switching is performed between the ignition position and the matching position, thereby realizing impedance matching in different pulse periods.

More specifically, the impedance matching method includes the following steps:

Step 1: determining, in real time, whether or not the current reflection coefficient $|\Gamma|$ is no greater than the ignition reflection coefficient $|\Gamma t|$. If the current reflection coefficient $|\Gamma|$ is determined to be greater than the ignition reflection coefficient $|\Gamma t|$, Step 2 is executed, otherwise, the fine adjustment step is executed; and Step 2: the coarse adjustment step is executed in real time based on the current load impedance, and Step 1 is returned to.

Further, before the coarse adjustment step, the method further includes: determining whether or not a current time point (a current moment) is within a high voltage level period of the pulse period when the matching has not been realized. If the current time point is within a high voltage level period of the pulse period when the matching has not been realized, the coarse adjustment step is executed; otherwise, the current position remains unchanged.

Further, when the current time period is determined to be within the high voltage level period of the pulse period given that the matching has not been realized, the pulsed RF power supply uses a frequency-sweep mode to perform automatic impedance matching.

Further, the fine adjustment step further includes: storing the matching position when the impedance matching is realized.

Further, the switching step includes: after the impedance matching is realized for the first time, switching from the ignition position to the matching position in the high voltage level period of each subsequent pulse period, and switching from the matching position to the ignition position in the low voltage level period of each subsequent pulse period.

As another aspect, the present disclosure further provides an impedance matching device for a pulsed RF power supply that is configured to realize matching between the load impedance of the pulsed RF power supply and the characteristic impedance of the pulsed RF power supply. The device includes: a coarse adjusting unit, a fine adjusting unit and a switching unit. The coarse adjusting unit is configured to adjust, according to a current load impedance, a current reflection coefficient |Γ| to be no greater than the ignition reflection coefficient |Γt|, and set a current position as an ignition position. The fine adjusting unit is configured to keep the ignition position to be unchanged when the current reflection coefficient |Γ| is no greater than the ignition reflection coefficient |Γt|, perform real-time adjustment based on the current load impedance to realize impedance matching, and set the current position as a matching position. The switching unit is configured to switch between the ignition position and the matching position in different pulse time durations of each subsequent pulse period after the impedance matching is realized for the first time, such that impedance matching in different pulse periods may be realized.

Further, the device further includes: a control module, a reflection coefficient determination module and a calculation module. The calculation module is configured to calculate, in real time, the current load impedance and the current reflection coefficient |Γ| of the pulsed RF power supply, send the current load impedance to the coarse adjusting unit and the fine adjusting unit, and send the current reflection coefficient |Γ| to the reflection coefficient determination module. The reflection coefficient determination module is configured to determine whether or not the current reflection coefficient |Γ| is no greater than the ignition reflection coefficient |Γt|.I If the current reflection coefficient |Γ| is determined to be greater than the ignition reflection coefficient |Γt|, a first identification signal is sent to the control module; otherwise, a second identification signal is sent to the control module. The control module is configured to trigger the coarse adjusting unit upon receival of the first identification signal sent from the reflection coefficient determination module, and trigger the fine adjusting unit upon receival of the second identification signal sent from the reflection coefficient determination module.

Further, the coarse adjusting unit includes an adjustable capacitor and/or an adjustable inductor. The coarse adjusting unit is configured to adjust, in real time, a position of the adjustable capacitor and/or the adjustable inductor according to the current load impedance sent from the calculation module, such that the current reflection coefficient |Γ| is adjusted to be no greater than the ignition reflection coefficient |Γt|. Further, the coarse adjusting unit set the current position of the adjustable capacitor and/or the adjustable inductor as the ignition position.

Further, the fine adjusting unit includes a fixed capacitor and/or a fixed inductor, and an on-off switch connected in series therewith. The fine adjusting unit is configured to control, in real time, the on or off of the on-off switch based on the current load impedance sent from the calculation module to realize the impedance matching, and set the current state of the on-off switch to be a matching on-off state.

Further, the device further includes a pulse period determination module configured to determine whether or not a current time point is in a high voltage level period of the pulse period when the matching has not been realized. If yes, the coarse adjusting unit is triggered, otherwise, the current position remains unchanged.

Further, the device further includes a storage module configured to store the matching position when the fine adjusting unit performs real-time adjustment based on the current load impedance to realize impedance matching.

Further, the switching unit is configured to, after the impedance matching is realized for the first time, switch from the ignition position to the matching position in the high voltage level period of each subsequent pulse period and switch from the matching position to the ignition position in the low voltage level period of each subsequent pulse period.

The present disclosure has the following beneficial effects.

In the impedance matching method for a pulsed RF power supply provided by the present disclosure, by virtue of the coarse adjustment step, adjustment is performed based on the current load impedance, such that the current reflection coefficient |Γ| is no greater than the ignition reflection coefficient |Γt|, and the current position is set as the ignition position. Further, by virtue of the fine adjustment step, the ignition position remains unchanged, real-time adjustment is performed to realize impedance matching based on the current load impedance, and the current position is set as the matching position. Further by virtue of the switching step, after the impedance matching is realized for the first time, in different pulse time durations in each subsequent pulse period, switching is performed between the ignition position and the matching position. More specifically, in the high voltage level period of each subsequent pulse period, the initial position is switched to the matching position, and in the low voltage level period of each subsequent pulse period, the matching position is switched to the ignition position. Accordingly, ignition may be realized directly in the high voltage level period of the next pulse period, and the re-matching may be realized by switching the ignition position to the matching position. Thus, the matching time of each subsequent pulse period is the switching time between the ignition position and the matching position. As such, different from the matching time of each subsequent pulse period in the prior art being a relatively long time required by the automatic frequency sweeping and repeated adjustments of the load impedance to realize the matching, the processing stability may be enhanced, and utilization of the pulsed RF power supply may be improved.

In the impedance matching device for a pulsed RF power supply provided by the present disclosure, by virtue of the coarse adjusting unit and based on the current load impedance, the current reflection coefficient |Γ| is adjusted to be no greater than the ignition reflection coefficient |Γt|, and the current position is set as the ignition position. When the current reflection coefficient |Γ| is no greater than the ignition reflection coefficient |Γt|, the fine adjusting unit keeps the ignition position unchanged, performs real-time adjustment to realize impedance matching based on the current load impedance, and sets the current position to be the matching position. Further, the switching unit switches between ignition position and the matching position in different pulse time durations of each subsequent pulse period after the impedance matching is realized for the first time. More specifically, the switching unit switches from the initial position to the matching position in the high voltage level period of each subsequent pulse period, and switches from the matching position to the ignition position in the low voltage level period of each subsequent pulse period, thereby ensuring that the ignition can be realized directly in a high voltage level period of a next pulse period, and re-matching may be realized by switching the ignition position to the matching position. As such, different from the matching time of each subsequent pulse period in the prior art being a relatively long time required by the automatic frequency sweeping and repeated adjustments of the load impedance to realize the matching, the processing stability may be enhanced, and utilization of the pulsed RF power supply may be improved.

DETAILED DESCRIPTION

To make those skilled in the relevant art better understand technical solutions of the present disclosure, an impedance matching method and device thereof for a pulsed RF power supply provided by the present disclosure will be described in detail hereinafter with reference to the accompanying drawings.

Figure 6:
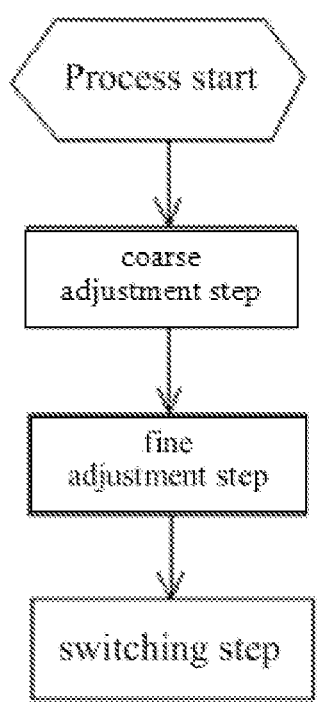
FIG. 6 is a flow chart of an impedance matching method for a pulsed RF power supply according to a first embodiment of the present disclosure.

FIG. 6 is a flow chart of an impedance matching method for a pulsed RF power supply provided by a first embodiment of the present disclosure. Referring to FIG. 6, the impedance matching method for a pulsed RF power supply provided by a first embodiment of the present disclosure is used for matching a load impedance of the pulsed RF power supply with a characteristic impedance (e.g., 50 ohms) of the pulsed RF power supply, and the impedance matching method includes the following steps.

A coarse adjustment step: performing adjustment based on a current load impedance, such that a current reflection coefficient $|\Gamma|$ is no greater than an ignition reflection coefficient $|\Gamma t|$, and setting a current position as an ignition position.

The physical meaning of the reflection coefficient $|\Gamma|$ of a pulsed RF power supply is a ratio of a reflected voltage wave to an incident voltage wave at a load impedance point of the pulsed RF power supply. The ignition reflection coefficient $|\Gamma t|$ refers to the reflection coefficient $|\Gamma|$ corresponding to the load impedance when the pulsed RF power supply realizes ignition in a reaction chamber. For a certain processing process, the load impedance and the reflection coefficient $|\Gamma|$ of the pulsed RF power supply when the reaction chamber realizes ignition are constants. However, because parameters such as the chamber pressure and the process gas in different processing processes have certain influence on the pulsed RF power supply when realizing ignition in the reaction chamber, the load impedance and the reflection coefficient $|\Gamma|$ of the pulsed RF power supply when realizing ignition in the reaction chamber often vary in different processing processes.

Figure 5:
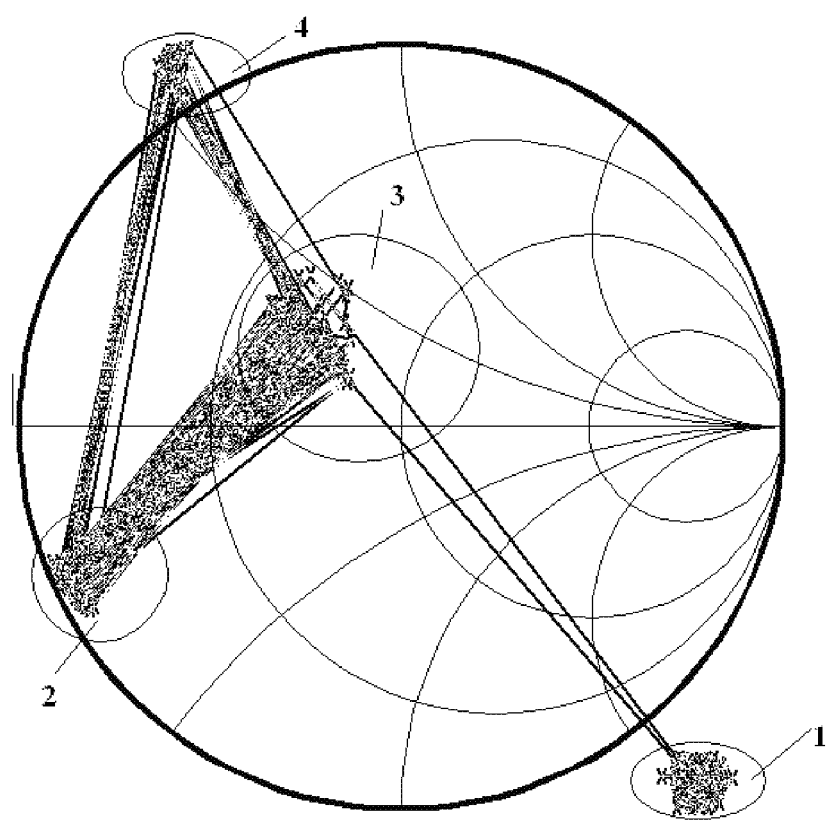
FIG. 5 is a trajectory graph of a load impedance of a second RF power supply during an impedance matching process correspondingly reflected in the Smith chart.

Here, FIG. 5 needs to be further illustrated. In FIG. 5, the impedance zone 2 indicates a load impedance value when a process gas at the beginning of a high voltage level period is not ignited, and the impedance zone 3 indicates a load impedance value when the process gas is ignited and stabilized and impedance matching is basically realized in the high voltage level period. Between the impedance zone 2 and the impedance zone 3, a load impedance value (not shown in the drawings), exists in the corresponding high voltage level period at the moment when the process gas is ignited, and such load impedance value is close to the impedance zone 3.

Therefore, the object of the coarse adjustment step according to the present disclosure is to find a load impedance value when an impedance matching state is nearly achieved. That is, in a decreasing process of the current reflection coefficient $|\Gamma|$ from a value greater than the ignition reflection coefficient $|\Gamma t|$ to a value equal to the ignition reflection coefficient $|\Gamma t|$, the current load impedance value gradually approaches the load impedance value in the impedance matching state. That is, the current load impedance value gradually moves from a range of the impedance zone 2 towards a range of the impedance zone 3 in FIG. 5. It is specified that when the current reflection coefficient $|\Gamma|$ is no greater than the ignition reflection coefficient $|\Gamma t|$, the current load impedance value is the load impedance value at the instant moment when the process gas is ignited, and thus the position of each component in the current condition is set as the ignition position. By then, the impedance matching has not been realized.

A fine adjusting step: keeping the ignition position to be unchanged, performing adjustment in real time based on the current load impedance to realize the impedance matching, and setting the current position as a matching position.

After the coarse adjustment step, given each component at the ignition position remains unchanged, the fine adjusting step is performed until the load impedance value when impedance matching is realized is found. That is, the current load impedance value is adjusted to be located in the impedance zone 3 in FIG. 5, and the position of each component at this moment is stored as the matching position.

After the aforementioned two steps, the present disclosure obtains two positions, namely, the ignition position and the matching position, and the impedance matching for the current pulsed RF power supply is fulfilled simultaneously for the first time.

A switching step: after the impedance matching is realized for the first time, in different pulse time durations of each subsequent pulse period (i.e., high voltage level period and low voltage level period), switching is performed between the ignition position and the matching position to realize impedance matching in different pulse periods. Specifically, during each pulse period after the first impedance matching, in the initial stage of the high voltage level period, each component is at the ignition position to allow the process gas to be ignited; and then each component is switched from the status of ignition position to the status of matching position, thereby realizing impedance matching.

As such, when at the ignition position and the current reflection coefficient |Γ| is no greater than the ignition reflection coefficient |Γt|, the pulsed RF power supply may realize the ignition of the process gas. Later, the pulsed RF power supply may realize impedance matching when in the matching position. Thus, in the switching step, in the high voltage level period of each subsequent pulse period after the impedance matching is realized for the first time, repeat matching may no longer be needed as that described in existing technologies where load impedance is adjusted repeatedly via automatic frequency sweeping, and impedance matching may be realized by switching the ignition position to the matching position. Further, in the low voltage level period of each subsequent pulse period, each component may be switched from the matching position to the ignition position. Accordingly, ignition may be ensured to be realized directly in the high voltage level period of the next pulse period, and re-matching may be realized by switching the ignition position to the matching position. Thus, in one embodiment, in the high voltage level period of each subsequent pulse period after the impedance matching is realized for the first time, the matching time is a switching time during which the ignition position is switched to the matching position. The matching time is a period of time that a matching process takes to switch an unmatched state to a matched state. By comparing the prior art and the disclosed embodiments, in each subsequent pulse period after the impedance matching is realized for the first time, the matching time in the prior art is relatively long because a relatively long time is spent on automatic frequency sweeping and repeated adjustment of the load impedance to realize matching. However, in embodiments of the present disclosure, repeat adjustment of the load impedance is no longer needed, and matching may be realized by switching each component from the ignition position to the matching position. Thus, the matching time is short, and the matching efficiency is high, such that the stability of the process and the utilization of the pulsed RF power supply may be improved.

More specifically, in one embodiment, the impedance matching method includes the following steps:

Step S1: determining, in real time, whether or not the current reflection coefficient |Γ| is no greater than the ignition reflection coefficient |Γt|. If the current reflection coefficient |Γ| is determined to be greater than the ignition reflection coefficient |Γt|, Step S2 is executed, otherwise, the fine adjustment step is executed.

Step S2: performing the coarse adjustment step in real time based on the current load impedance, and returning to Step S1.

Through Step S1 and Step S2, real-time determination and adjustment may be realized until the current reflection coefficient |Γ| is no greater than the ignition reflection coefficient |Γt|.

Preferably, before the coarse adjustment step, the method further includes: determining whether or not a current moment is in a high voltage level period of the pulse period when matching is not realized. If yes, the coarse adjustment step is executed; otherwise, the current moment is in the low voltage level period of the pulse period and the current position remains unchanged. As such, the disclosed impedance matching method may perform the coarse adjustment step only in the high voltage level period of a current pulse period when the matching has not been realized, and no operation is performed in the low voltage level period. Thus, "blind adjustment" may be avoided compared to the prior art in which the execution mechanism is controlled to adjust, in the low voltage level period, the impedance adjustable element based on the load impedance at the last time point of the high voltage level period. Accordingly, the occurrence of the over-adjustment phenomenon may be avoided, thereby improving the matching efficiency when the impedance matching is realized for the first time.

Further and preferably, when the current moment is determined to be in the high voltage level period of the pulse period when matching has not been realized, the pulsed RF power supply uses the frequency-sweep mode to perform automatic impedance matching. That is, the pulsed RF power supply automatically adjusts the pulse frequency to perform matching, which may not only further enhance the matching efficiency but also improve the matching accuracy.

Further, the fine adjustment step further includes: storing the matching position when the impedance matching is realized.

Figure 7:
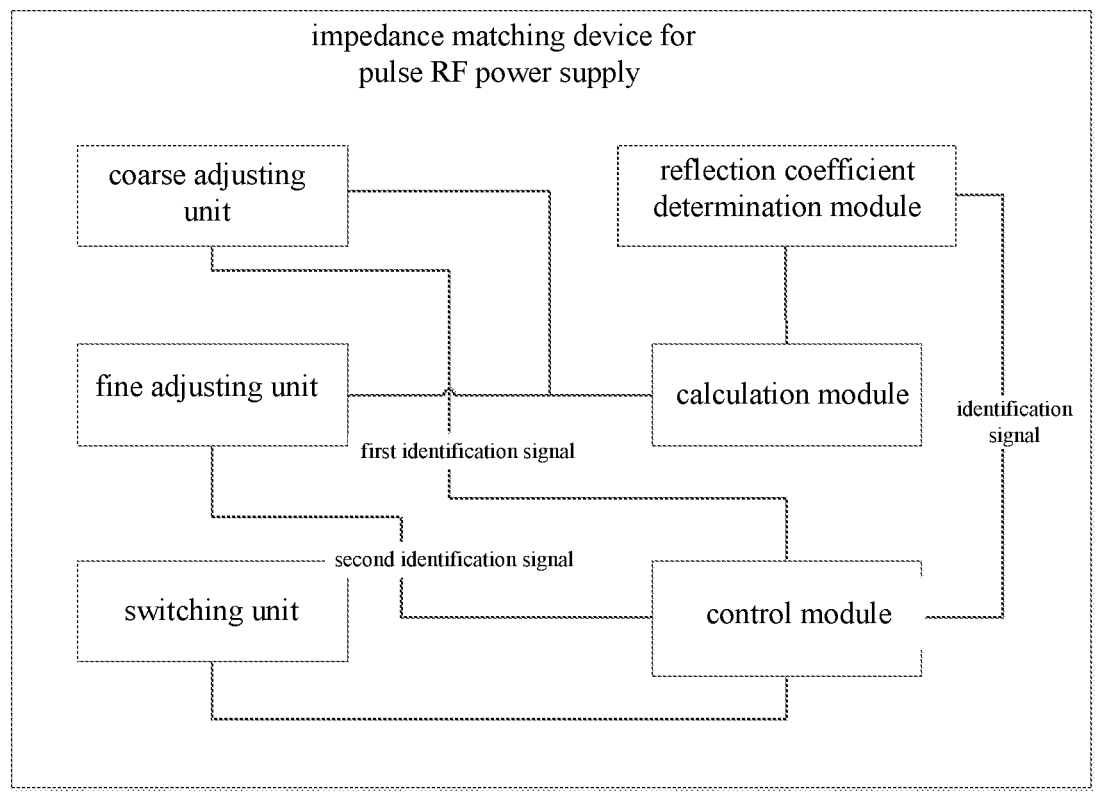
FIG. 7 is a principle block diagram of an impedance matching device for a pulsed RF power supply according to a second embodiment of the present disclosure.

FIG. 7 is a principle block diagram of an impedance matching device for a pulsed RF power supply provided by a second embodiment of the present disclosure. Referring to FIG. 7, the impedance matching device is configured to match a load impedance of the pulsed RF power supply with a characteristic impedance (e.g., 50 ohms) of the pulsed RF power supply. The impedance matching device includes a coarse adjusting unit, a fine adjusting unit, and a switching unit. The coarse adjusting unit is configured to perform adjustment based on a current load impedance, such that a current reflection coefficient |Γ| is no greater than the ignition reflection coefficient |Γt|, and set a current position as an ignition position. The physical meaning of the reflection coefficient |Γ| of the pulsed RF power supply is a ratio of a reflected voltage wave to an incident voltage wave at a load impedance point of the pulsed RF power supply, and the ignition reflection coefficient |Γt| refers to the reflection coefficient |Γ| corresponding to the load impedance of the pulsed RF power supply when ignition is realized in a reaction chamber. For a certain processing process, the load impedance and the reflection coefficient |Γ| of the pulsed RF power supply when ignition is realized in the reaction chamber are constants. However, because parameters such as the chamber pressure and the process gas in different processing processes have certain influence on the the pulsed RF power supply to realize ignition in the reaction chamber, the load impedance and the reflection coefficient |Γ| of the pulsed RF power supply when ignition is realized in the reaction chamber often vary in different processing processes.

The fine adjusting unit is configured to allow the ignition position to remain unchanged when the current reflection coefficient |Γ| is no greater than the ignition reflection coefficient |Γt|, perform adjustment in real time based on the current load impedance to realize impedance matching, and set the current position as the matching position.

The switching unit is configured to switch, in different pulse time durations (i.e., a high voltage level period and a low voltage level period) of the same subsequent pulse period after impedance matching is realized for the first time, between the ignition position and the matching position, thereby realizing impedance matching in different pulse periods.

As such, when at the ignition position and the current reflection coefficient |Γ| is no greater than the ignition reflection coefficient |Γt|, the pulsed RF power supply may realize the ignition of the process gas. Later, when at the matching position, the pulsed RF power supply may realize impedance matching. Thus, by virtue of the switching unit, in the high voltage level period of each subsequent pulse period after the impedance matching is realized for the first time, repeat matching to repeatedly adjust the load impedance by automatic frequency sweeping may no longer needed as described in existing technologies, and impedance matching may be realized by simply switching the ignition position to the matching position. Further, in the low voltage level period of each subsequent pulse period after the impedance matching is realized for the first time, the matching position may be switched to the ignition position. Accordingly, ignition may be ensured to be realized directly in the high voltage level period of the next pulse period, and re-matching may be realized by switching the ignition position to the matching position. Accordingly, in the present disclosure, in the high voltage level period of each subsequent pulse periods after impedance matching is realized for the first time, the matching time is the switching time that switches the ignition position to the matching position. The matching time is a period of time used by the matching process to change from an unmatched state to a matched state. By comparing the prior art and embodiments of the present disclosure, in each subsequent pulse period after the impedance matching is achieved for the first time, the matching time in the prior art is found to be relatively long because a relatively long time is needed to realize matching by automatic frequency sweeping and repeated adjustment of the load impedance. However, in embodiments of the present disclosure, repeated adjustment of the load impedance may no longer be needed, and matching may be realized by simply switching each component from the ignition position to the matching position. Accordingly, the matching time is short, and the matching efficiency is high, such that the stability of the process and the utilization of the pulsed RF power supply may be improved.

In one embodiment, the impedance matching device further includes a control module, a calculation module and a reflection coefficient determination module. The calculation module is configured to calculate the current load impedance and the current reflection coefficient |Γ| of the pulsed RF power supply in real time, send the current load impedance to the coarse adjusting unit and the fine adjusting unit, and send the current reflection coefficient |Γ| to the reflection coefficient determination module. The reflection coefficient determination module is configured to determine whether or not the current reflection coefficient |Γ| is no greater than the ignition reflection coefficient |Γt|. If the current reflection coefficient |Γ| is determined to be greater than the ignition reflection coefficient |Γt|, a first identification signal (e.g., a high voltage level "1") is sent to the control module, otherwise, a second identification signal (e.g., a low voltage level "0") is sent to the control module. The control module is configured to trigger the coarse adjusting unit upon receival of the first identification signal, and trigger the fine adjusting unit upon receival of the second identification signal.

Figure 8:
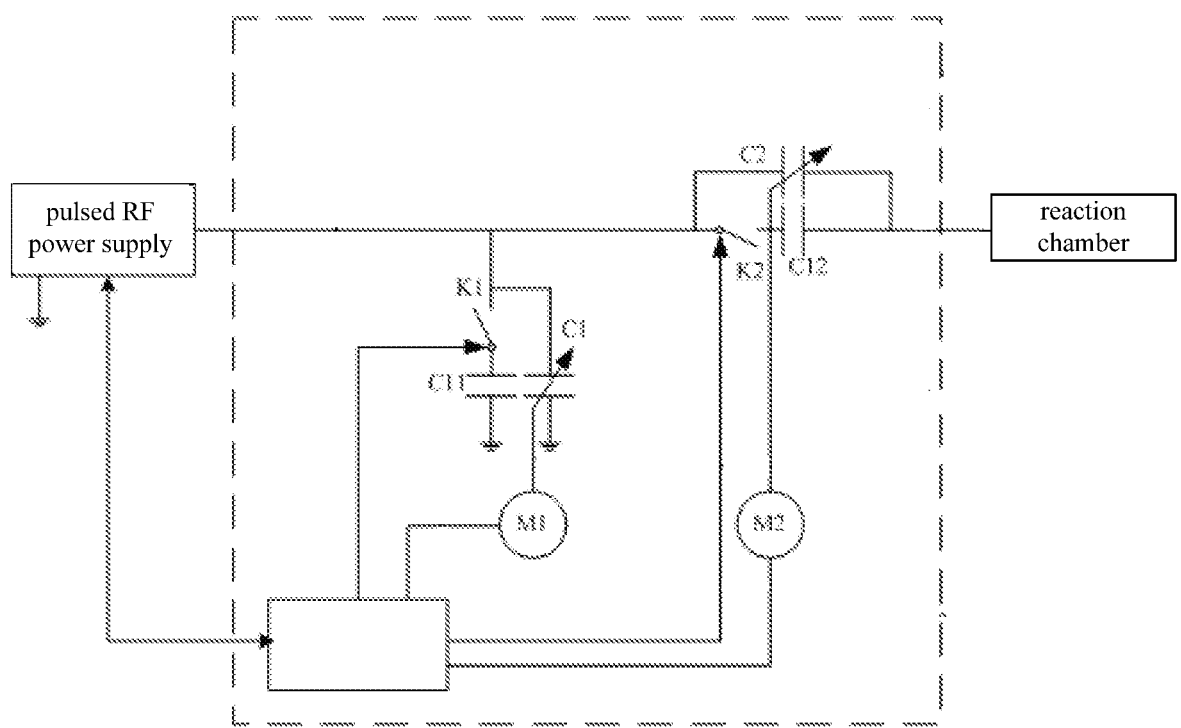
FIG. 8 is a schematic diagram of a coarse adjusting unit and a fine adjusting unit in FIG. 7.

Further, the coarse adjusting unit includes an adjustable capacitor and/or an adjustable inductor. Under such situation, the coarse adjusting unit is configured to adjust the adjustable capacitor and/or the adjustable inductor in real time based on the current load impedance sent by the calculation module and adjust the current reflection coefficient |Γ| to be no greater than the ignition reflection coefficient |Γt|. Accordingly, the process gas may be ignited, and the current position(s) of the adjustable capacitor and/or the adjustable inductor may be set as the ignition position(s). To adjust the adjustable capacitor and/or the adjustable inductor, the coarse adjusting unit further includes a motor, etc., and the motor may be a stepper motor. As shown in FIG. 8, the disclosed coarse adjusting unit includes adjustable capacitors C1 and C2; a driving motor M1 is connected to an adjustment terminal of the adjustable capacitor C1 for adjusting the adjustable capacitor C1; and a driving motor M2 is connected to an adjustment terminal of the adjustable capacitor C2 for adjusting the adjustable capacitor C2.

The fine adjusting unit includes a fixed capacitor and/or a fixed inductor, and an on-off switch connected in series therewith. As shown in FIG. 8, the fine adjusting unit includes two branches, where one branch includes an on-off switch K1 and a fixed capacitor C11 connected in series, and the other branch includes an on-off switch K2 and a fixed capacitor C12 connected in series. The on-off switches K1 and K2 include an electronic switch such as a diode or relays. Under such situation, the fine adjusting unit is configured to control on or off of the on-off switches (K1 and K2) in real time based on the current load impedance sent by the calculation module to realize impedance matching. Further, the state of the on-off switches (K1 and K2) that realizes impedance matching is set to be matching on-off state (also referred to as a "matching position"). For example, if the on-off switch K1 is turned on and the on-off switch K2 is turned off when the impedance matching is realized, the matching on-off status (matching position) is that the on-off switch K1 is turned on and the on-off switch K2 is turned off.

Further, the impedance matching device further includes a storage module, and the storage module is configured to store the matching position(s) when the fine adjusting unit performs real-time adjustment based on the current load impedance to realize impedance matching. More specifically, the on-off status of the on-off switches K1 and K2 is stored.

Preferably, in one embodiment, the impedance matching device further includes a pulse period determination module, and the pulse period determination module is configured to determine whether or not a current moment is in a high voltage level period of the pulse period when matching has not been realized. If the current moment is determined to be in a high voltage level period of the pulse period when matching has not been realized, the coarse adjusting unit is triggered, otherwise, the current position remains to be unchanged. That is, C1, C2, K1 and K2 each maintains a corresponding position. As such, when the disclosed impedance matching device has not realized impedance matching for the first time, the coarse adjusting unit is triggered if the current moment is in the high voltage level period, and no operation is performed if the current moment is in the low voltage level period. Thus, "blind adjustment" may be avoided compared to that in the prior art in which the execution mechanism is controlled to adjust, in the low voltage level period, the impedance adjustable element based on the load impedance at the last time point of the high voltage level period when the impedance matching has not been realized for the first time. Thus, the occurrence of the over-adjustment phenomenon may be avoided, thereby improving the matching efficiency of achieving the impedance matching for the first time.

Further, in one embodiment, the pulsed RF power supply has an automatic frequency-sweep mode for performing automatic impedance matching when determining whether or not the current moment is in the high voltage level period before the impedance matching is realized for the first time. That is, the pulse frequency of the pulsed RF power supply is automatically adjusted to perform matching. It can be understood that, by using the pulsed RF power supply to perform automatic frequency-sweep matching in the high voltage level period of the pulse period, not only the matching efficiency is improved, but also the matching accuracy is improved.

Figure 1:
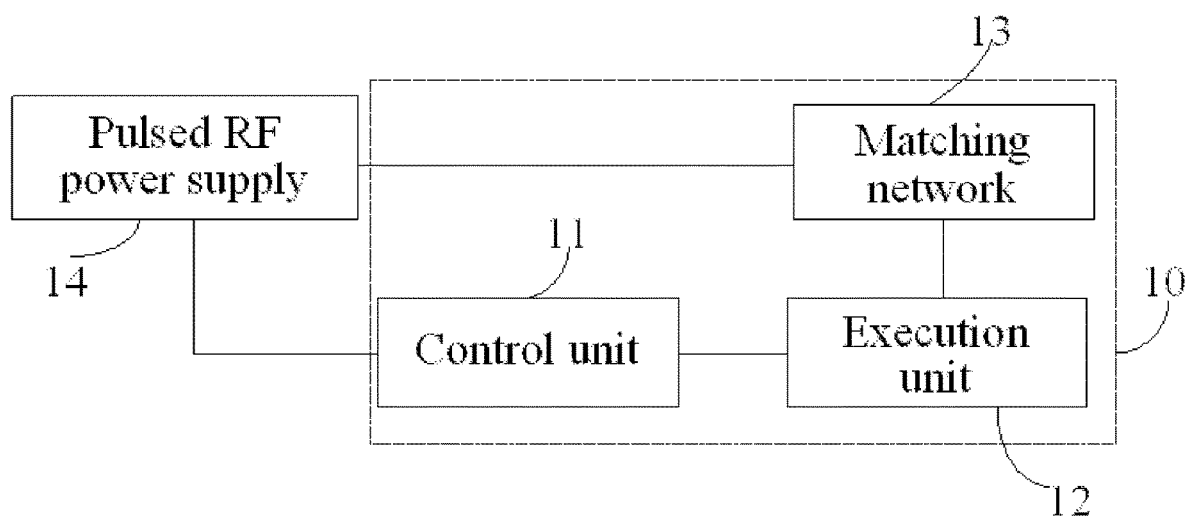
FIG. 1 is a principle block diagram for applying an existing impedance matching device.
Figure 2:
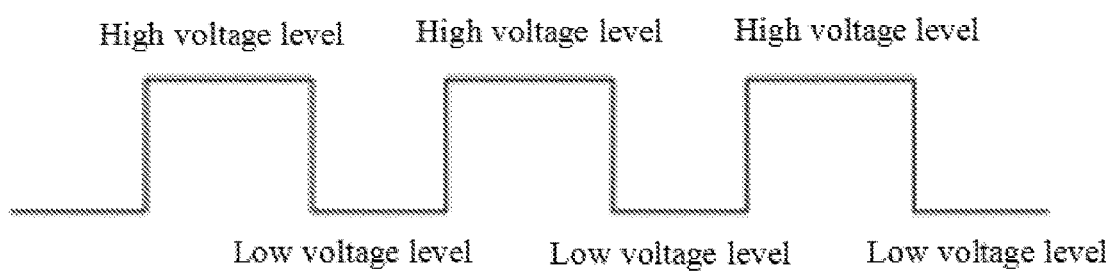
FIG. 2 is a waveform diagram of a pulse synchronous signal of a pulsed RF power supply.
Figure 3:
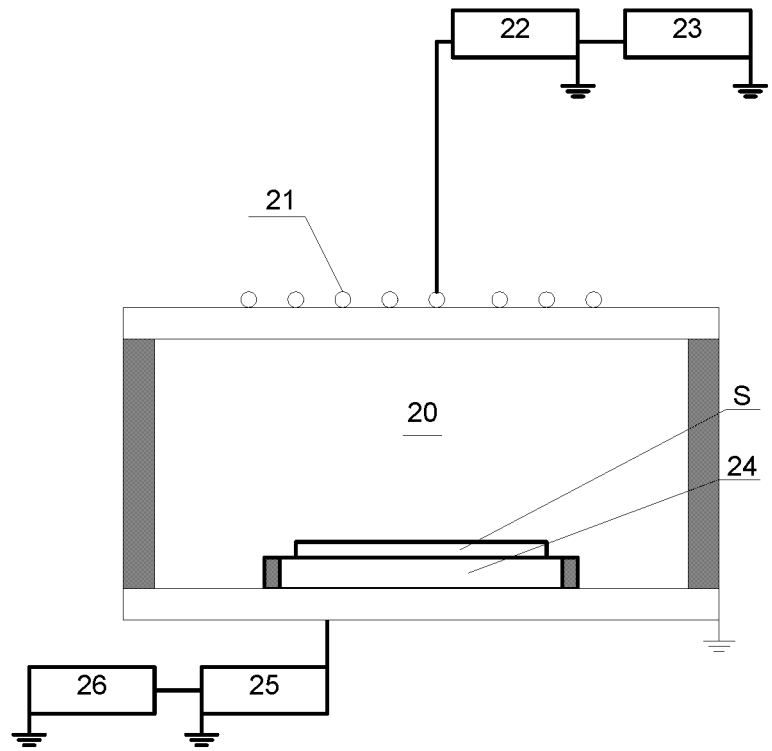
FIG. 3 is a structural schematic diagram of a reaction chamber using an existing impedance matching device.

Hereinafter, how the impedance matching device provided by the present disclosure improves the impedance matching rate is validated by experiments. In this experiment, the reaction chamber shown in FIG. 3 is used, the second impedance matching device uses the impedance matching device provided by the above embodiment of the present disclosure, and other parameters are the same as that in the prior art.

Under the aforementioned conditions, if the current reflection coefficient |Γ| is greater than the ignition reflection coefficient |Γt| at the very beginning of the matching, descriptions will be given with reference to FIG. 9, FIG. 10 and FIG. 11.

Figure 9:
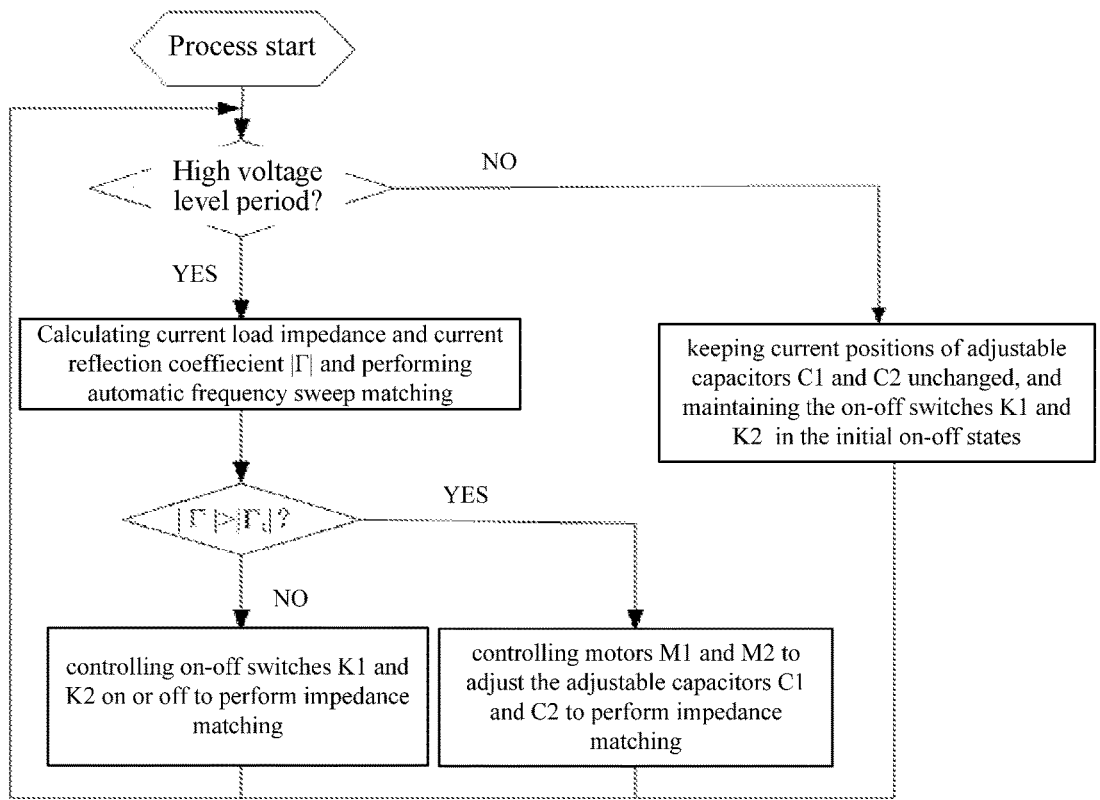
FIG. 9 is an operational flow chart of an impedance matching device shown in FIG. 7.
Figure 10:
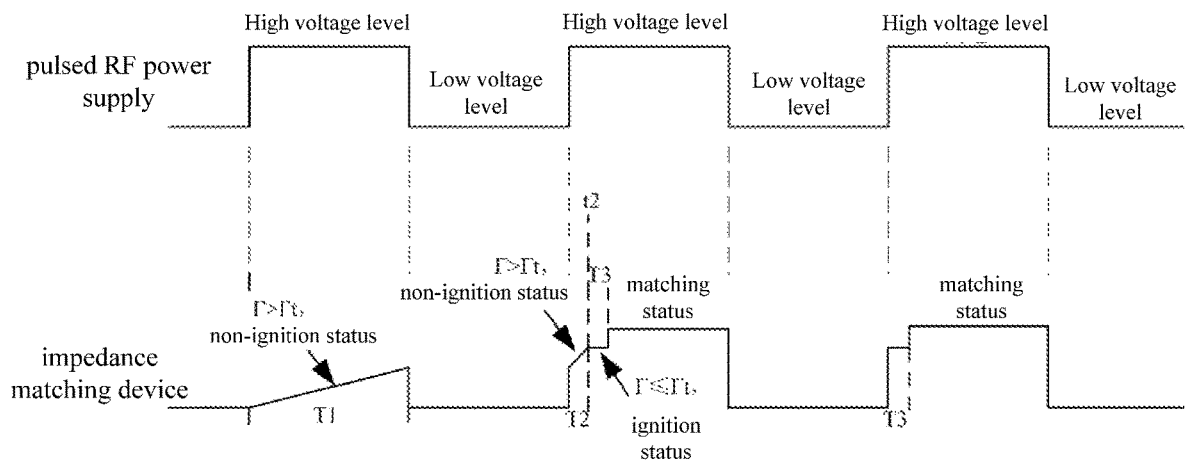
FIG. 10 is a schematic diagram illustrating matching statuses of an impedance matching device when impedance matching is performed at different time points under a situation where a current reflection coefficient $|\Gamma|$ is greater than an ignition reflection coefficient $|\Gamma t|$.
Figure 11:
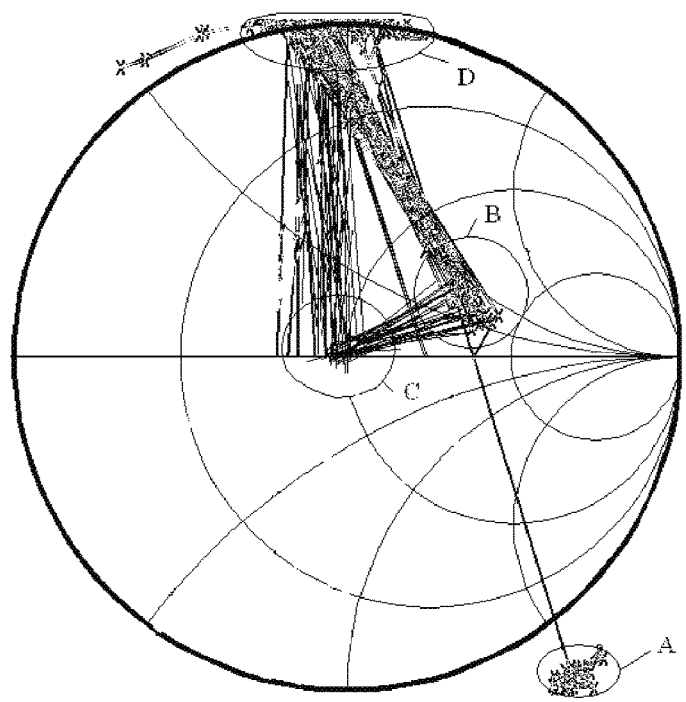
FIG. 11 is a trajectory graph of a load impedance of a pulsed RF power supply during an impedance matching process correspondingly reflected in the Smith chart.

As shown in FIG. 9, FIG. 10 and FIG. 11, when the pulsed RF power supply is not turned on, the load impedance of the pulsed RF power supply is an impedance induced by the interference signal, as represented by the impedance zone A outside of the circle in the Smith chart. After the pulsed RF power supply is turned on, the pulse synchronous signal is sent to the pulse period determination module, and the pulse period determination module determines in real time whether or not the current moment is the high voltage level period of the first pulse period. On one hand, if the pulse period determination module determines that the current time period is the high voltage level period of the first pulse period, the pulsed RF power supply performs automatic frequency-sweep matching. Further, the calculation module starts to calculate the current load impedance and the current reflection coefficient |Γ| in real time, send the current load impedance to the coarse adjusting unit and the fine adjusting unit, and send the current reflection coefficient |Γ| to the reflection coefficient determination module. During the whole high voltage level period T1, if the reflection coefficient determination module determines in real time that the current reflection coefficient |Γ| from the calculation module is greater than the ignition reflection coefficient |Γt|, the ignition of the process gas in the reaction chamber is indicated as not realized, and the reflection coefficient determination module sends the first identification signal "1" to the control module. When the control module receives the first identification signal "1", the coarse adjusting unit is triggered, such that the coarse adjusting unit adjusts the adjustable capacitors C1 and C2 in real time based on the current load impedance from the calculation module. That is, matching is performed by using a "motor matching mode". In such matching process, the load impedance of the pulsed RF power supply moves from the non-ignited impedance zone (not shown in FIG. 11) towards the matched impedance zone C. Further, in the matching process, the on-off switches K1 and K2 do not move and are in the initial on-off status.

On the other hand, if the pulse period determination module determines in real time that the current time period is the low voltage level period of the first pulse period, the current positions of the adjustable capacitors C1 and C2 remain unchanged and a next pulse period is waited, such that the high voltage level of the next pulse period continues to move towards the impedance matching zone C. By then, the load impedance of the pulsed RF power supply is located in the impedance zone D and is the coupling signal impedance of the inductance coil.

If the pulse period determination module determines that the current time period is the high voltage level period of the second pulse period, the pulsed RF power supply performs automatic frequency-sweep matching. Further, the calculation module starts to calculate the current load impedance and the current reflection coefficient |Γ| in real time, sends the current load impedance to the coarse adjusting unit and the fine adjusting unit, and sends the current reflection coefficient |Γ| to the reflection coefficient determination module. If the reflection coefficient determination module determines, in real time, that the current reflection coefficient |Γ| from the calculation module is greater than the ignition reflection coefficient |Γt| during the time period T2, ignition is indicated as having not been realized in the reaction chamber. Further, the reflection coefficient determination module sends the first identification signal "1" to the control module. Upon receival of the first identification signal "1" sent from the determination module, the coarse adjusting unit is triggered, the "motor matching mode" is used to continue matching, and the load impedance continues to move towards the impedance matching zone C. If the reflection coefficient determination module determines that the current reflection coefficient |Γ| from the calculation module is no greater than the ignition reflection coefficient |Γt| at a time point t2, ignition in the reaction chamber is indicated as being realized. By then, the current load impedance moves to the impedance zone B corresponding to the reaction chamber that realizes ignition, and the reflection coefficient determination module sends the second identification signal "0" to the control module. Upon receival of the second identification signal "0", the fine adjusting unit is triggered, such that the current positions (i.e., the ignition positions) of the adjustable capacitors C1 and C2 remain unchanged. The on-off switches K1 and K2 are controlled to be on or off in real time based on the current load impedance sent from the calculation module. That is, the matching is performed by using a "switch matching mode", where the impedance matching is achieved after the on-and-off response time T3 (i.e., a switching time) of the on-off switches K1 and K2. By then, the current load impedance rapidly moves from the impedance zone B to the impedance matching zone C near the impedance matching point after the on-off response time T3. By then, the load impedance may move to the impedance matching point because of the automatic frequency-sweep matching of the pulsed RF power supply. Further, when the impedance matching is realized by using the "switch matching mode", the storage module stores the current on-and-off states of the on-off switches K1 and K2 as the matching on-off states.

If the pulse period determination module determines in real time that the current time period is the low voltage level period of the second pulse period, although impedance matching has been realized in the high voltage level period of the second pulse period, impedance matching needs to be re-performed in a next pulse period. Thus, the ignition positions of the adjustable capacitors C1 and C2 remain unchanged, and the on-off switches K1 and K2 are switched from the matching on-off states to the initial on-off states. In such low voltage level period, the load impedance of the pulsed RF power supply is located in the impedance zone D and is the coupling signal impedance of the inductance coil.

If the pulse period determination module determines that the current time period is the high voltage level period of the third pulse period, the pulsed RF power supply performs automatic frequency-sweep matching. The calculation module calculates the current load impedance and the current reflection coefficient in real time, sends the current load impedance to the coarse adjusting unit and the fine adjusting unit, and sends the current reflection coefficient to the reflection coefficient determination module. Because the adjustable capacitors C1 and C2 are at the ignition positions and the on-off switches K1 and K2 are in the initial on-off states, the reflection coefficient determination module determines that the current reflection coefficient $|\Gamma|$ transmitted from the calculation module is no greater than the ignition reflection coefficient $|\Gamma t|$. By then, it means that ignition in the reaction chamber is realized, the load impedance is located in the impedance zone B, and the reflection coefficient determination module sends the second identification signal "0" to the control module. Upon receival of the second identification signal "0", the control module triggers the fine adjusting unit to keep the ignition positions of the adjustable capacitors C1 and C2 to be unchanged and directly control the on-off switches K1 and K2 to switch from the initial on-off states to the matching on-off states. The impedance matching is realized after the switching time T3 of the on-off switches K1 and K2, and the load impedance rapidly moves from the impedance zone B to the impedance matching zone C near the impedance matching point after the period of time T3, and the load impedance is adjusted to be located at the impedance matching point by the automatic frequency-sweep matching of the pulsed RF power supply.

If the pulse period determination module determines that the current time period is the low voltage level period of the third pulse period, although the impedance matching has been achieved in the high voltage level period of the third pulse period, the impedance matching needs to be re-performed in a next pulse period. Thus, the ignition positions of the adjustable capacitors C1 and C2 are kept unchanged, and the on-off switches K1 and K2 are switched from the matching on-off states to the ignition on-off states. In such low voltage level period, the load impedance of the pulsed RF power supply is located in the impedance zone D and is the coupling signal impedance of the inductance coil.

Situations in the high and low voltage level periods of the fourth pulse period and each subsequent pulse period are the same as the situations in the high and low voltage level periods of the third pulse period, and such rules are maintained until the process ends.

If the current reflection coefficient $|\Gamma|$ is no greater than the ignition reflection coefficient $|\Gamma t|$ at the very beginning of the matching, the description are given hereinafter with reference to FIG. 9, FIG. 11 and FIG. 12.

Figure 12:
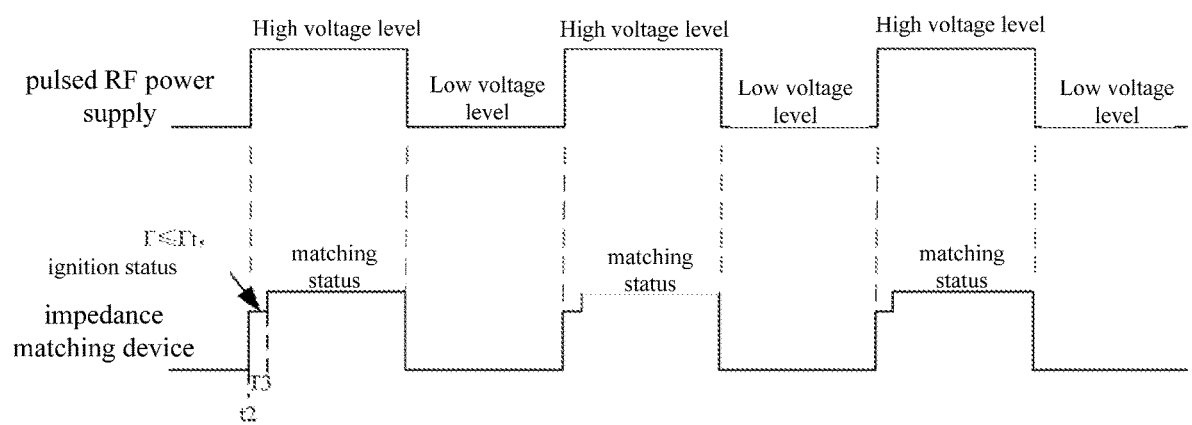
FIG. 12 is a schematic diagram illustrating matching statuses of an impedance matching device when impedance matching is performed at different time points under a situation where a current reflection coefficient $|\Gamma|$ is no greater than an ignition reflection coefficient $|\Gamma t|$.

As shown in FIG. 9, FIG. 11 and FIG. 12, when the pulsed RF power supply is not turned on, the load impedance of the pulsed RF power supply is located in the impedance zone A outside of the circle in the Smith chart, and is an impedance induced by the interference signal. After the pulsed RF power supply is turned on, the pulse synchronous signal is sent to the pulse period determination module, and the pulse period determination module determines in real time whether or not the current time period is the high voltage level period of the first pulse period. On one hand, if the pulse period determination module determines that the current time period is the high voltage level period of the first pulse period, the pulsed RF power supply performs automatic frequency-sweep matching. Further, the calculation module starts to calculate the current load impedance and the current reflection coefficient $|\Gamma|$ in real time, send the current load impedance to the coarse adjusting unit and the fine adjusting unit, and send the current reflection coefficient $|\Gamma|$ to the reflection coefficient determination module. If the reflection coefficient determination module determines, at a time point t2, that the current reflection coefficient $|\Gamma|$ is no greater than the ignition reflection coefficient $|\Gamma t|$, it means that ignition in the reaction chamber is realized at the time point t2 and the current impedance is located in the impedance zone B. The reflection coefficient determination module sends the second identification signal "0" to the control module. Upon receival of the second identification signal "0", the control module triggers the fine adjusting unit to maintain the ignition positions (i.e., initial positions) of the adjustable capacitors C1 and C2 to be unchanged. Further, the on-off switches K1 and K2 are controlled to be on or off in real time based on the current load impedance sent from the calculation module. That is, the matching is performed by using the "switch matching mode", and the impedance matching is realized after the on-off response time T3 of the on-off switches K1 and K2. By then, the load impedance rapidly moves from the impedance zone B to the impedance matching zone C near the impedance matching point after the period of time T3, and the load impedance is adjusted to be at the impedance matching point by the automatic frequency-sweep matching of the pulsed RF power supply. Further, when the "switch matching mode" is used to realize impedance matching, the storage module stores the current on-off states of the on-off switches K1 and K2 as the matching on-off states.

On the other hand, if the pulse period determination module determines in real time that the current time period is the low voltage level period of the first pulse period, although impedance matching has been realized in the high voltage level period, impedance matching needs to be re-performed in a next pulse period. Thus, the positions of the adjustable capacitors C1 and C2 are kept unchanged, and the on-off switches K1 and K2 are switched from the matching on-off states to the initial on-off states. Further, in the low voltage level period, the load impedance of the pulsed RF power supply is located in the impedance zone D and is the coupling signal impedance of the inductance coil.

If the pulse period determination module determines that the current time period is the high voltage level period of the second pulse period, the pulsed RF power supply performs automatic frequency-sweep matching. Further, the calculation module calculates the current load impedance and the current reflection coefficient $|\Gamma|$ in real time, sends the current load impedance to the coarse adjusting unit and the fine adjusting unit, and sends the current reflection coefficient $|\Gamma|$ to the reflection coefficient determination module. Because the adjustable capacitors C1 and C2 are at the ignition positions and the on-off switches K1 and K2 are in the initial on-off states, the reflection coefficient determination module directly determines that the current reflection coefficient $|\Gamma|$ from the calculation module is no greater than the ignition reflection coefficient $|\Gamma t|$. By then, ignition in the reaction chamber is indicated as having been realized and the load impedance is located in the impedance zone B. The reflection coefficient determination module sends the second identification signal "0" to the control module. Upon receival of the second identification signal "0", the control module triggers the fine adjusting unit to keep the ignition positions of the adjustable capacitors C1 and C2 to be unchanged. Further, the control module directly controls the on-off switches K1 and K2 to switch from the initial on-off states to the matching on-off states. The impedance matching is realized after the switching time T3 of the on-off switches K1 and K2, and the load impedance rapidly moves from the impedance zone B to the impedance matching zone C near the impedance matching point after the switching time T3, and the load impedance is adjusted to be at the impedance matching point via the automatic frequency-sweep matching of the pulsed RF power supply.

If the pulse period determination module determines that the current time period is the low voltage level period of the second pulse period, although the impedance matching has been realized in the high voltage level period of the second pulse period, the impedance matching needs to be re-performed in a next pulse period. Thus, the positions of the adjustable capacitors C1 and C2 remain unchanged, such that the on-off switches K1 and K2 are switched from the matching on-off states to the initial on-off states. In the low voltage level period, the load impedance of the pulsed RF power supply is located in the impedance zone D and is the coupling signal impedance of the inductance coil.

Situations in high and low voltage level periods of the third pulse period and each subsequent pulse period are the same as the situations in the high and low voltage level periods of the second pulse period, and the rules are maintained until the process ends.

Figure 4:
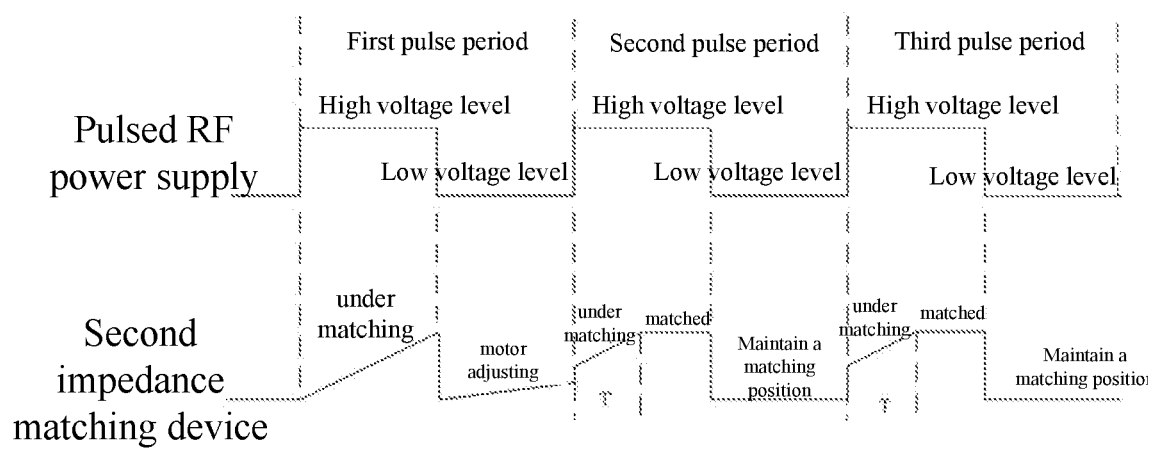
FIG. 4 is a schematic diagram illustrating matching statuses of a second impedance matching device at different time points during a impedance matching process.

By comparing FIG. 4, FIG. 10 and FIG. 12, existing technologies in FIG. 4 is found to, after impedance matching is realized for the first time, realize impedance matching after a relatively long time T for each subsequent pulse period. However, in embodiments of the present disclosure shown in FIG. 10 and FIG. 12, after impedance matching is realized for the first time, impedance matching may be realized after the switching time or on-off response time T3 for each subsequent pulse period, and T3<T. As such, the matching efficiency of the pulsed RF power supply provided by embodiments of the present disclosure may be improved.

It should be noted that, in one embodiment, the matching network of the impedance matching device has a circuit structure of an L shape, but the present disclosure is not limited thereto. In practical applications, circuit structures of the matching network may also include an inverted-L shape, a T shape, or a π shape, etc.

It should further be noted that, although the fine adjusting unit in the present disclosure includes a fixed capacitor and/or a fixed inductor and an on-off switch connected in series therewith, and the switching between the ignition position and the matching position is realized by the on or off of the on-off switch. However, the present disclosure is not limited thereto. In practical applications, other methods may also be used to rapidly switch between the ignition position and the matching position. Further, although a fixed capacitor and an on-off switch connected in series therewith are provided respectively in two branches of the fine adjusting unit in the present disclosure, the present disclosure is not limited thereto. In practical applications, each branch may include a plurality of capacitors and/or inductors and a plurality of on-off switches connected in series therewith, and the reactance value of the fine adjusting unit is changed via a combination of the on/off states of each on-off switch.

It should further be noted that, the impedance matching device provided by the present disclosure does not limit the RF frequency of the pulsed RF power supply 30. For example, the RF frequency may be 400 kHz, 2 MHz, 3 MHz, 27 MHz, 40 MHz, or 60 MHz, etc. Further, the pulse frequency and the pulse duty cycle of the pulsed RF power supply 30 are also not limited. For example, the pulse frequency may be within 1 MHz, and the pulse duty cycle may be any value less than 1.

It can be understood that the foregoing implementations are merely exemplary implementations used for describing the principle of the present disclosure, but the present disclosure is not limited thereto. Those ordinarily skilled in the art may make various variations and improvements without departing from the spirit and essence of the present invention, and these variations and improvements shall all fall within the protection scope of the present disclosure.

What is claimed is:

1. An impedance matching method for a pulsed RF power supply, comprising:
    a coarse adjustment step: performing adjustment based on a current load impedance to make a current reflection coefficient |Γ| no greater than an ignition reflection coefficient |Γt|, and setting a current position to be an ignition position;
    a fine adjustment step: keeping the ignition position to be unchanged, performing adjustment in real time based on the current load impedance to realize impedance matching, and setting the current position to be a matching position; and
    a switching step: switching between the ignition position and the matching position in different pulse time durations of each subsequent pulse period after impedance matching is realized for a first time, thereby realizing impedance matching in different pulse periods.

2. The impedance matching method according to claim 1, wherein the impedance matching method comprises:
    Step 1: determining, in real time, whether or not the current reflection coefficient |Γ| is no greater than the ignition reflection coefficient |Γt|; if the current reflection coefficient |Γ| is determined to be greater than the ignition reflection coefficient |Γt|, Step 2 is executed, otherwise, the fine adjustment step is executed; and
    Step 2: performing the coarse adjustment step in real time based on the current load impedance, and returning to Step 1.

3. The impedance matching method according to claim 1, wherein before the coarse adjusting step, the method further comprises:
    determining whether or not a current moment is in a high voltage level period of a pulse period when matching has not been realized; if the current moment is determined to be in the high voltage level period of the pulse period when matching has not been realized, executing the coarse adjustment step; otherwise, maintaining the current position to be unchanged.

4. The impedance matching method according to claim 3, wherein when the current moment is determined to be in the high voltage level period of the pulse period when the matching has not been realized, the pulsed RF power supply uses a frequency-sweep mode to perform automatic impedance matching.

5. The impedance matching method according to claim 1, wherein the fine adjustment step further comprises:
    storing the matching position when impedance matching is realized.

6. The impedance matching method according to claim 1, wherein the switching step comprises:

after impedance matching is realized for the first time, switching from the ignition position to the matching position in a high voltage level period of each subsequent pulse period, and switching from the matching position to the ignition position in a low voltage level period of each subsequent pulse period.

7. An impedance matching device for a pulsed RF power supply configured to match a load impedance of the pulsed RF power supply with a characteristic impedance of the pulsed RF power supply, wherein the device comprises a coarse adjusting unit, a fine adjusting unit, and a switching unit, wherein:

the coarse adjusting unit is configured to adjust, based on a current load impedance, a current reflection coefficient $|\Gamma|$ to be no greater than an ignition reflection coefficient $|\Gamma t|$, and set a current position as a ignition position;

the fine adjusting unit is configured to maintain the ignition position to be unchanged when the current reflection coefficient $|\Gamma|$ is no greater than the ignition reflection coefficient $|\Gamma t|$, perform adjustment in real time based on the current load impedance to realize impedance matching, and set a current position as a matching position; and the switching unit is configured to switch between the ignition position and the matching position in different pulse time durations of each subsequent pulse period after impedance matching is realized for a first time, thereby realizing impedance matching in different pulse periods.

8. The impedance matching device according to claim 7, further comprising a control module, a reflection coefficient determination module, and a calculation module, wherein:

the calculation module is configured to calculate, in real time, the current load impedance and the current reflection coefficient $|\Gamma|$ of the pulsed RF power supply, send the current load impedance to the coarse adjusting unit and the fine adjusting unit, and send the current reflection coefficient $|\Gamma|$ to the reflection coefficient determination module;

the reflection coefficient determination module is configured to determine whether or not the current reflection coefficient $|\Gamma|$ is no greater than the ignition reflection coefficient $|\Gamma t|$, if the current reflection coefficient $|\Gamma|$ is determined to be greater than the ignition reflection coefficient $|\Gamma t|$, send a first identification signal to the control module, otherwise, send a second identification signal to the control module; and the control module is configured to trigger the coarse adjusting unit upon receival of the first identification signal sent from the reflection coefficient determination module, and trigger the fine adjusting unit upon receival of the second identification signal sent from the reflection coefficient determination module.

9. The impedance matching device according to claim 8, wherein the coarse adjusting unit comprises an adjustable capacitor and/or an adjustable inductor, wherein:

the coarse adjusting unit is configured to adjust, in real time, a position of the adjustable capacitor and/or the adjustable inductor based on the current load impedance sent from the calculation module to adjust the current reflection coefficient $|\Gamma|$ to be no greater than the ignition reflection coefficient $|\Gamma t|$, and set a current position of the adjustable capacitor and/or the adjustable inductor as the ignition position.

10. The impedance matching device according to claim 8, wherein the fine adjusting unit comprises a fixed capacitor and/or a fixed inductor, and an on-off switch connected in series therewith, wherein:

the fine adjusting unit is configured to control, in real time, the on-off switch to be on or off based on the current load impedance sent from the calculation module to realize impedance matching, and set a current state of the on-off switch to be a matching on-off state.

11. The impedance matching device according to claim 7, wherein the device further comprises:

a pulse period determination module, configured to determine whether or not a current moment is in a high voltage level period of a pulse period when matching has not been realized, if the current moment is determined to be in the high voltage level period of the pulse period when matching has not been realized, trigger the coarse adjusting unit, otherwise, maintain the current position to be unchanged.

12. The impedance matching device according to claim 7, wherein the device further comprises:

a storage module, configured to store the matching position when the fine adjusting unit performs adjustment in real time based on the current load impedance to realize impedance matching.

13. The impedance matching device according to claim 7, wherein the switching unit is configured to, after impedance matching is realized for the first time, switch from the ignition position to the matching position in a high voltage level period of each subsequent pulse period and switch from the matching position to the ignition position in a low voltage level period of each subsequent pulse period.

* * * * *